(12) United States Patent
Kilger et al.

(10) Patent No.: US 9,147,585 B2
(45) Date of Patent: Sep. 29, 2015

(54) METHOD FOR FABRICATING A PLURALITY OF SEMICONDUCTOR DEVICES

(71) Applicant: Infineon Technologies AG, Neubiberg (DE)

(72) Inventors: Thomas Kilger, Regenstauf (DE); Ulrich Wachter, Regensburg (DE); Dominic Maier, Pleystein (DE); Gottfried Beer, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/535,591

(22) Filed: Nov. 7, 2014

(65) Prior Publication Data

US 2015/0064846 A1    Mar. 5, 2015

Related U.S. Application Data

(62) Division of application No. 13/774,541, filed on Feb. 22, 2013, now Pat. No. 8,890,284.

(51) Int. Cl.
    *H01L 21/44*    (2006.01)
    *H01L 21/48*    (2006.01)
    (Continued)

(52) U.S. Cl.
CPC .............. *H01L 21/561* (2013.01); *H01L 21/78* (2013.01); *H01L 21/82* (2013.01); *H01L 23/49822* (2013.01); *H01L 23/5384* (2013.01); *H01L 23/5389* (2013.01); *H01L 24/19* (2013.01); *H01L 24/24* (2013.01); *H01L 24/25* (2013.01); *H01L 24/82* (2013.01); *H01L 25/50* (2013.01); *H01L 27/04* (2013.01); *H01L 28/00* (2013.01); *H01L 21/568* (2013.01); *H01L 23/3128* (2013.01); *H01L 23/49816* (2013.01); *H01L 2224/04105* (2013.01); *H01L 2224/12105* (2013.01); *H01L 2224/16145* (2013.01); *H01L 2224/16225* (2013.01); *H01L 2224/24137* (2013.01); *H01L 2224/73267* (2013.01); *H01L 2924/1305* (2013.01);
(Continued)

(58) Field of Classification Search
CPC ......... H01L 21/44; H01L 21/48; H01L 21/50; H01L 21/82
USPC .......... 438/106, 111, 613, 686; 257/528, 777, 257/E21.499
See application file for complete search history.

(56) References Cited

U.S. PATENT DOCUMENTS 7,326,592 B2    2/2008    Meyer et al.
7,858,440 B2    12/2010    Pressel et al.
(Continued)

FOREIGN PATENT DOCUMENTS

DE    102009015722 A1    10/2009
DE    102008039388 B4    2/2011
JP    2006287235 A    10/2006

*Primary Examiner* — Phuc Dang
(74) *Attorney, Agent, or Firm* — Slater & Matsil, L.L.P.

(57) ABSTRACT

A number of semiconductor chips each include a first main face and a second main face opposite to the first main face. A first encapsulation layer is applied over the second main faces of the semiconductor chips. An electrical wiring layer is applied over the first main faces of the first semiconductor chips. A second encapsulation layer is applied over the electrical wiring layer. The thickness of the first encapsulation layer and the thicknesses of the first semiconductor chips is reduced. The structure can be singulated to obtain a plurality of semiconductor devices.

9 Claims, 17 Drawing Sheets

(51) Int. Cl.
*H01L 21/50* (2006.01)
*H01L 21/82* (2006.01)
*H01L 21/56* (2006.01)
*H01L 23/538* (2006.01)
*H01L 27/04* (2006.01)
*H01L 49/02* (2006.01)
*H01L 23/00* (2006.01)
*H01L 21/78* (2006.01)
*H01L 25/00* (2006.01)
*H01L 23/498* (2006.01)
*H01L 23/31* (2006.01)

(52) U.S. Cl.
CPC ............... *H01L 2924/13055* (2013.01); *H01L 2924/13091* (2013.01); *H01L 2924/1461* (2013.01); *H01L 2924/15311* (2013.01); *H01L 2924/19105* (2013.01)

(56) References Cited

U.S. PATENT DOCUMENTS

| | | |
|---|---|---|
| 2002/0192867 A1 | 12/2002 | Nishiyama |
| 2004/0209399 A1 | 10/2004 | Sunohara et al. |
| 2007/0161266 A1 | 7/2007 | Nishizawa |
| 2009/0014876 A1 | 1/2009 | Youn et al. |
| 2009/0095518 A1* | 4/2009 | Matsushita et al. ........... 174/261 |
| 2009/0261468 A1 | 10/2009 | Kroeninger et al. |
| 2011/0291252 A1* | 12/2011 | Hosseini ....................... 257/676 |
| 2012/0018897 A1 | 1/2012 | Park et al. |
| 2012/0104606 A1* | 5/2012 | Okuda et al. .................. 257/738 |
| 2012/0146209 A1 | 6/2012 | Hu et al. |
| 2013/0062761 A1* | 3/2013 | Lin et al. ....................... 257/738 |
| 2013/0203215 A1* | 8/2013 | Hung et al. ................... 438/107 |

* cited by examiner

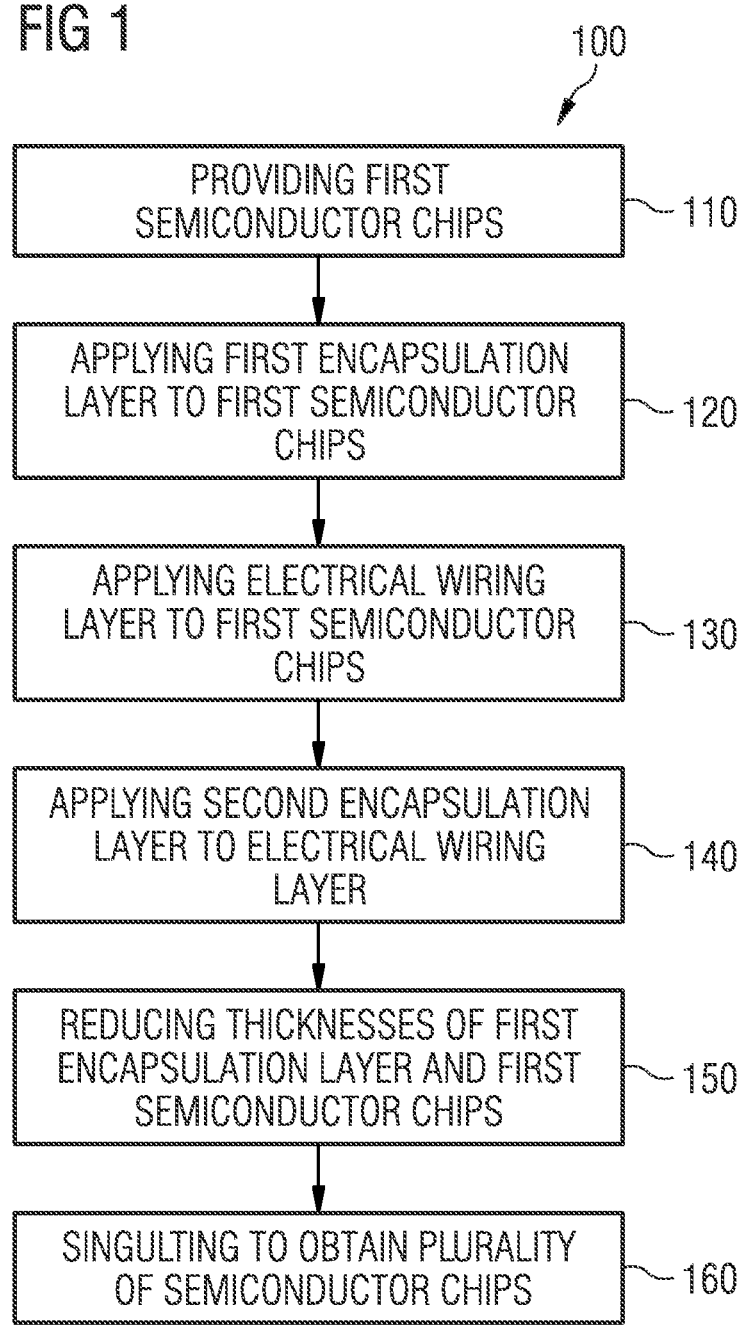

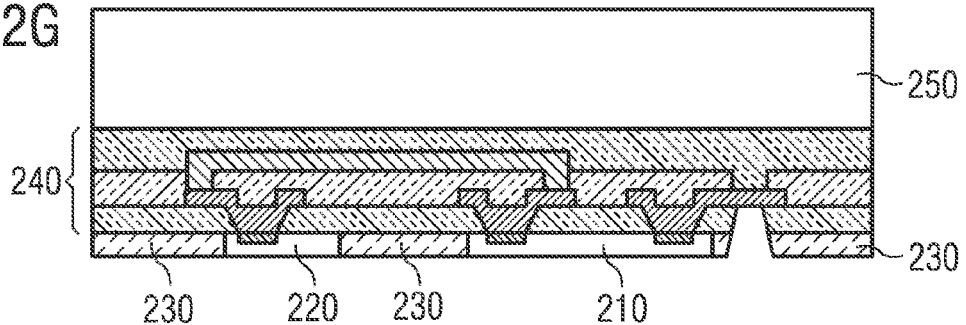
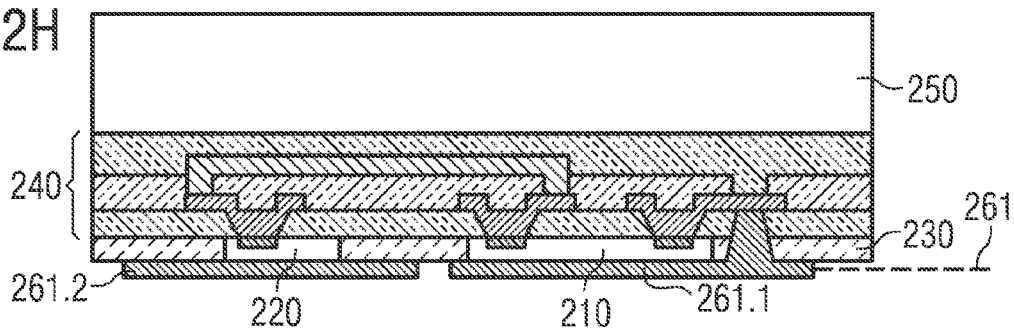
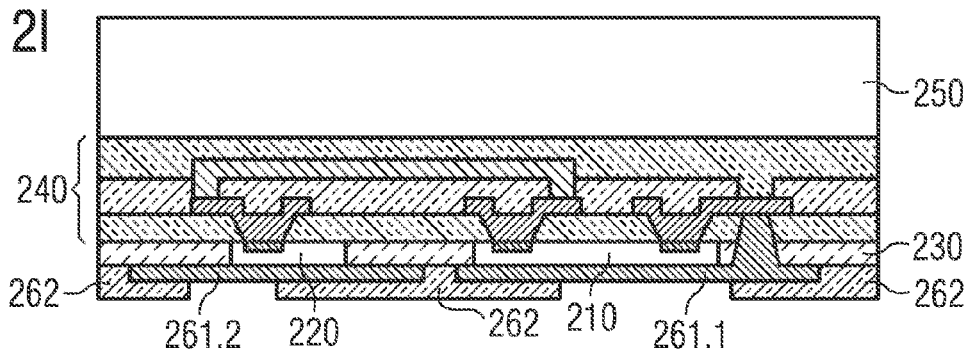
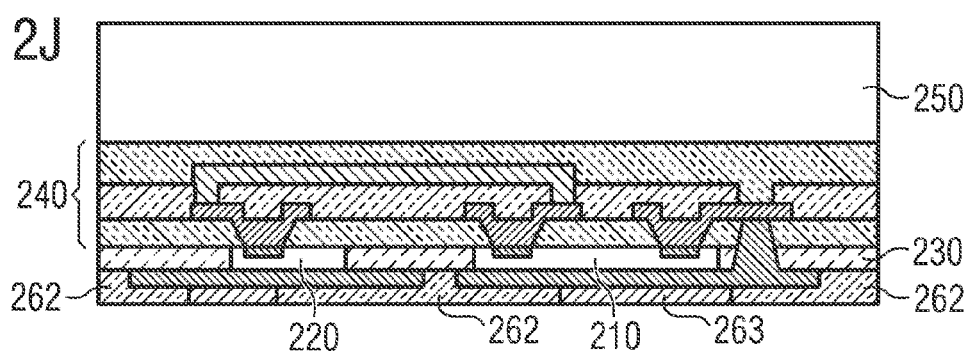

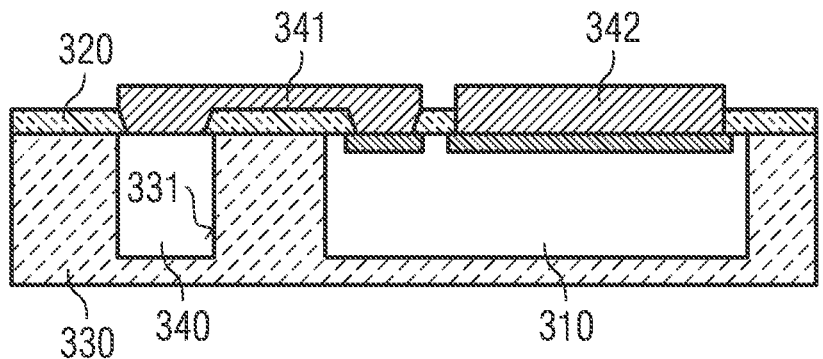
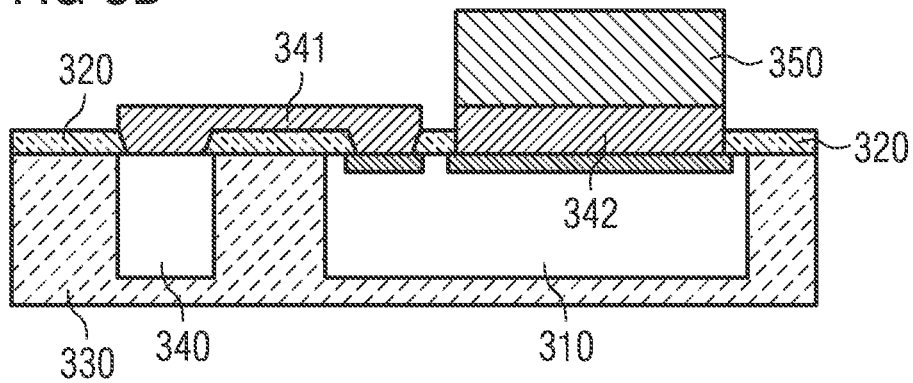
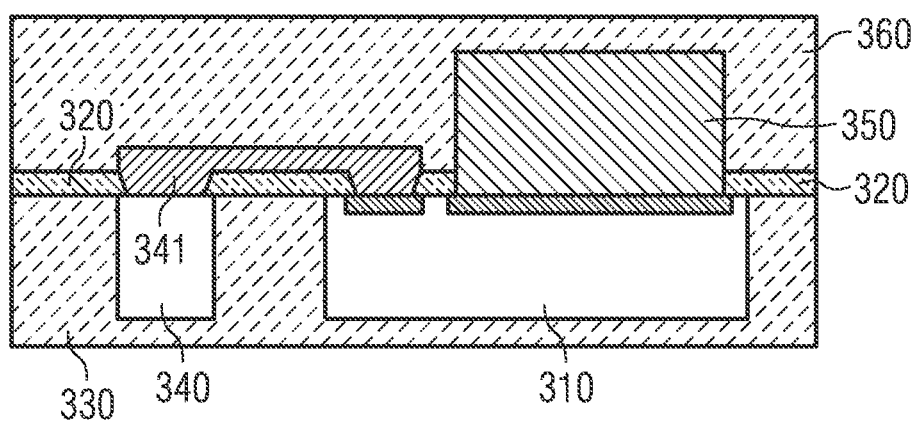

METHOD FOR FABRICATING A PLURALITY OF SEMICONDUCTOR DEVICES

This is a divisional application of U.S. application Ser. No. 13/774,541, entitled "Semiconductor Device" which was filed on Feb. 22, 2013 and issued on Nov. 18, 2014 as U.S. Pat. No. 8,890,284 and is incorporated herein by reference.

TECHNICAL FIELD

The present invention relates to a method for fabricating a semiconductor device and to a semiconductor device.

BACKGROUND

In power electronics very often semiconductor chips with vertical transistors like, for example, IGBT (Insulated Gate Bipolar Transistors) are used or, in general, transistors in which at least one electrical contact pad is arranged on a first main face of the semiconductor chip and at least one other electrical contact pad is arranged on a second main face opposite to the first main face. Several ones of these semiconductor power transistors can be connected to form particular power switches, power modules or power systems. In these power applications one important aspect is a low ON-resistance of the power device which means that firstly the vertical semiconductor dies should be fabricated with a low thickness and secondly, in case of interconnected power semiconductor chips, a direct interconnect between the drain pad of one chip to the source pad of a second chip should be achieved in order to have a very short connection and therefore a low resistivity and low parasitic effects.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 shows a flow diagram for illustrating a method for fabricating a semiconductor device according to an embodiment;

FIGS. 2A-2J show schematic cross-sectional side view representations for illustrating an example of a method for fabricating a semiconductor device comprising an over-mold layer and two thinned or unthinned semiconductor chips which each could also comprise a vertical current flow;

FIGS. 3A-3F show schematic cross-sectional side view representations for illustrating an example of a method for fabricating a semiconductor device comprising an over-mold layer and a thinned semiconductor chip together with a double side cooling configuration;

DETAILED DESCRIPTION OF ILLUSTRATIVE EMBODIMENTS

Figure 2A:
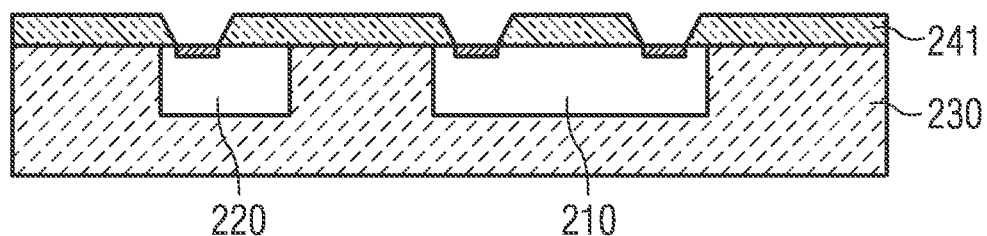

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include," "have," "with" or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements cooperate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of a method for fabricating a semiconductor device and of a semiconductor device may use various types of semiconductor chips or semiconductor chip modules or circuits incorporated in the semiconductor chips, among them logic integrated circuits, analogue integrated circuits, mixed signal integrated circuits, sensor circuits, MEMS (Micro-Electro-Mechanical-Systems), power integrated circuits, chips with integrated passives, diodes like flyback diodes, etc. The embodiments may also use semiconductor chips comprising MOS transistor structures or vertical transistor structures like, for example, IGBT (Insulated Gate Bipolar Transistor) structures or, in general, transistors or other structures or devices in which at least one electrical contact pad is arranged on a first main face of the semiconductor chip and at least one other electrical contact pad is arranged on a second main face of the semiconductor chip opposite to the first main face of the semiconductor chip. The semiconductor chips may also comprise optical devices like, for example, light emitting diodes, laser diodes, or optical receiver diodes.

The semiconductor chips may comprise contact elements or contact pads on one or more of their outer surfaces wherein the contact elements serve for electrically contacting the semiconductor chips. The contact elements may have any desired form or shape. They can, for example, have the form of lands, i.e., flat contact layers on an outer surface of the semiconductor chip. The contact elements or contact pads may be made from any electrically conducting material, e.g., from a metal as aluminum, gold, or copper, for example, or a metal alloy, or an electrically conducting organic material, or an electrically conducting semiconductor material. The contact elements may also be formed as layer stacks of one or more of the above-mentioned materials.

The embodiments of a method for fabricating a semiconductor device and of a semiconductor device may comprise an encapsulant or encapsulating material having the semiconductor chips or semiconductor chip modules embedded therein. The encapsulating material can be any electrically insulating material like, for example, any kind of molding material, any kind of resin material, or any kind of epoxy material. The encapsulating material can also be a polymer material, a polyimide material, a thermoplast material, a silicone material, a ceramic material, and a glass material. The encapsulating material may also comprise any of the above-mentioned materials and further include filler materials embedded therein like, for example, thermally conductive increments. These filler increments can be made of AlO or $Al_2O_3$, AlN, BN, or SiN, for example. The semiconductor chip panel fabricated by an embodiment of the method can have the form of a wafer, i.e., a circular form, but is not limited to the form and shape of a wafer but can have any size and shape and any suitable arrangement of semiconductor chips or semiconductor chip modules embedded therein.

In the claims and in the following description different embodiments of a method for fabricating a semiconductor device are described as a particular sequence of processes or measures, in particular in the flow diagram. It is to be noted that the embodiments should not be limited to the particular sequence described. Particular one or all of different processes or measures can also be conducted simultaneously or in any other useful and appropriate sequence.

Embodiments of a semiconductor device may include one or more of individual semiconductor chips or semiconductor chip modules. The semiconductor chip modules may include one or more semiconductor chips, in particular power transistor chips, and they may include at least one further semiconductor chip which may include one or more of a logic circuit or a driver circuit. In particular, the semiconductor chip modules may comprise the so-called intelligent power modules (IPMs). The semiconductor device may also comprise any other kind of semiconductor chips as were mentioned above. The semiconductor device may comprise semiconductor chips arranged in a stacked configuration, i.e., arranged in different levels one above the other. The semiconductor device may also comprise semiconductor chips connected with each other to form a bridge circuit, i.e., a half-bridge circuit or a full-bridge circuit, such as those used for power switch modules.

FIG. 1 shows a flow diagram for illustrating a method for fabricating a semiconductor device according to an embodiment. The method 100 of FIG. 1 comprises providing a plurality of first semiconductor chips, each one of the first semiconductor chips comprising a first main face and a second main face opposite to the first main face according to block 110, applying a first encapsulation layer over the second main faces of the first semiconductor chips according to block 120, applying an electrical wiring layer over the first main faces of the first semiconductor chips according to block 130, applying a second encapsulation layer over the electrical wiring layer according to block 140, reducing the thickness of the first encapsulation layer and the thicknesses of the first semiconductor chips according to block 150, and singulating to obtain a plurality of semiconductor devices according to block 160.

According to an embodiment of the method 100 of FIG. 1, at least part of the first semiconductor chips comprise one or more of a transistor, a power transistor, a vertical transistor, a MOS transistor, an insulated gate bipolar transistor, a logic circuit, a sensor, and a passive component.

According to an embodiment of the method 100 of FIG. 1, the first encapsulation layer comprises one or more of an insulating material, a mold material, a polymer material, a polyimide material, a resin material, an epoxy-resin material, a silicone material, a ceramic material, and a glass material.

According to an embodiment of the method 100 of FIG. 1, the method 100 follows the concept of extended wafer level packaging by which a plurality of semiconductor devices are fabricated on one semiconductor chip panel. In particular, applying the first encapsulation layer over the second main faces of the first semiconductor chips comprises placing the first semiconductor chips on a carrier, covering the first semiconductor chips with a first encapsulation material so that the first encapsulation material covers the second main faces and the side faces of the first semiconductor chips, hardening the first encapsulation material and thus producing a semiconductor chip panel, and removing the carrier from the semiconductor chip panel.

According to an embodiment of the method 100 of FIG. 1, applying an electrical wiring layer over the first main faces of the first semiconductor chips comprises applying one or more dielectric layers, electrically conductive through-connections within the one or more dielectric layers, and one or more electrically conductive traces or wires on surfaces of the one or more dielectric layers, wherein the electrical traces or wires and the electrical through-connections are connected with electrical contact pads on the first main faces of the first semiconductor chips.

According to an embodiment of the method 100 of FIG. 1, applying the electrical wiring layer over the first main faces of the first semiconductor chips comprises fabricating a redistribution layer over the first main faces of the first semiconductor chips, the redistribution layer serving the purpose to electrically connect the electrical contact pads on the first main faces of the first semiconductor chips to electrical traces or wires in a plane above the plane of the electrical contact pads.

According to an embodiment of the method 100 of FIG. 1, reducing the thickness of the first encapsulation layer and the thicknesses of the first semiconductor chips is accomplished by one or more of grinding, planarizing, and polishing, in particular chemical-mechanical polishing (CMP). According to an embodiment, the thicknesses of the first semiconductor chips are reduced to a thickness in a range from 5 µm-150 µm. According to an embodiment, the thickness of the first encapsulation layer is reduced to the same thickness as that of the first semiconductor chips. As a result, the first semiconductor chips are covered by the first encapsulation layer only at their side faces.

According to an embodiment of the method 100 of FIG. 1, the method further comprises providing a plurality of second semiconductor chips. The second semiconductor chips can be provided in the same way as the first semiconductor chips so that in each one of the semiconductor devices to be fabricated, one first semiconductor chip and one second semiconductor chip is provided. The second semiconductor chip can be provided laterally side-by-side with respect to the first semiconductor chip and the thicknesses of the second semiconductor chips can be reduced in the same way as the thicknesses of the first semiconductor chips are reduced. The second semiconductor chips can also be applied over the electrical wiring layer so that in the semiconductor device to be fabricated, each one of the second semiconductor chips is situated with respect to one of the first semiconductor chips in a stacked relationship and electrically connected to the first semiconductor chip. The second semiconductor chips can be embedded within the second encapsulation layer.

According to an embodiment of the method 100 of FIG. 1, the second semiconductor chips can be of the same type as the first semiconductor chips or they can be of a different type. In particular, the second semiconductor chips may comprise one or more of an integrated circuit, a logic circuit, and a control circuit.

According to an embodiment of the method 100 of FIG. 1, the method further comprises providing a plurality of electrical devices and applying the electrical devices over the electrical wiring layer in such a way that each one of the electrical devices is electrically connected to one of the first semiconductor chips. The electrical devices can be embedded within the second encapsulation layer. At least part of the electrical devices may comprise one or more of a passive device, a resistor, an inductor, a coil, and a capacitor. The electrical devices may be configured in the form of surface mount devices (SMD).

The second encapsulation layer serves the purpose of facilitating the forming of a stable semiconductor chip panel so that thereafter the first encapsulation layer and the first semiconductor chips can be reduced in their thicknesses in a safe and reliable manner without occurrence of any cracks or damage. Thereafter, the second encapsulation layer can be maintained and may serve for different purposes of the semiconductor devices to be fabricated. One of these purposes is to embed a second or even more semiconductor chips or any other one or more electrical devices within each one of the semiconductor devices as explained above. Another purpose is the fabrication of special semiconductor chip packages with particular size dimensions or particular arrangement and configuration of external electrical contacts as will be shown in some more detail below.

Another embodiment of utilizing the second encapsulation layer will be as follows. After fabricating the electrical wiring layer, a vertical metallic bar can be applied over the electrical wiring layer, the vertical metallic bar being electrically connected to the electrical wiring layer. Then the second encapsulation layer may be applied in such a way that an upper surface of the encapsulation layer is flush with an upper surface of the vertical metallic bar, and then an electrical device can be applied over the second encapsulation layer, the electrical device being electrically connected with the vertical metallic bar. The electrical device may, for example, comprise an antenna.

Referring to FIGS. 2A-2J, an example of a method for fabricating a semiconductor device is illustrated. According to FIG. 2A, two semiconductor chips 210 and 220 are provided, wherein both of them may comprise vertical transistor devices, respectively. The semiconductor chips 210 and 220 may each comprise a first, upper main face and a second, lower main face, and side faces connecting the first and second main faces. The first and second semiconductor chips 210 and 220 are embedded in a first encapsulation layer 230 in such a way that the first encapsulation layer 230 covers the second main faces and the side faces of the semiconductor chips 210 and 220. This can be done, for example, by placing the semiconductor chips 210 and 220 on a carrier with the first main faces of the semiconductor chips 210 and 220 facing the carrier, applying the first encapsulation layer 230 onto the semiconductor chips 210 and 220 and the carrier and removing the carrier after hardening of the first encapsulation layer 230. Thereafter, a first redistribution layer 240 is applied onto the first main faces of the semiconductor chips 210 and 220 and the upper main face of the encapsulation layer 230 which is flush with the first main faces of the semiconductor chips 210 and 220. The first redistribution layer 240 comprises a first dielectric layer 241 which is applied onto the first main faces of the semiconductor chips 210 and 220 and the upper main face of the first encapsulation layer 230. Thereafter, the first dielectric layer 241 is selectively removed above electrical contact pads of the semiconductor chips 210 and 220, thereby creating through-holes in the first dielectric layer 241. As a result, an intermediate product, as shown in FIG. 2A, is obtained. It is to be understood that FIG. 2A shows only one of a plurality of identical sections of a semiconductor chip panel. The first encapsulation layer 230 extends over the entire semiconductor chip panel.

Figure 2B:
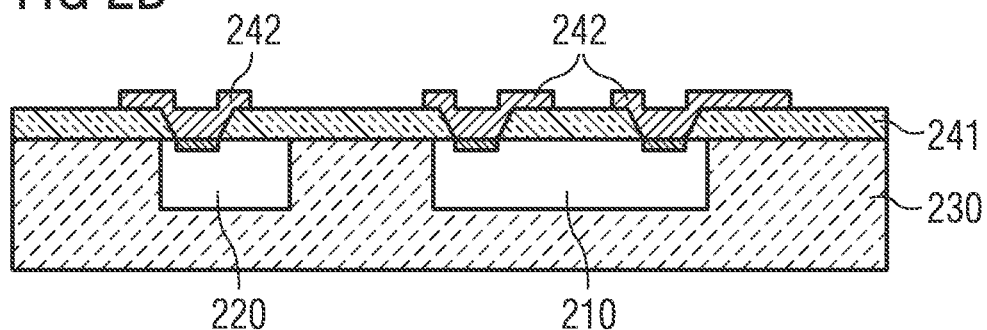

According to FIG. 2B, electrical through-connections are formed in the first dielectric layer 241 by filling the through-holes with an electrically conducting material as, for example, copper and then first electrical traces 242 are deposited on the first dielectric layer 241, each one of the first electrical traces 242 being connected with one of the electrical contact pads of the semiconductor chips 210 and 220 by one of the through-connections. The first electrical traces 242 can be fabricated of, for example, copper.

Figure 2C:
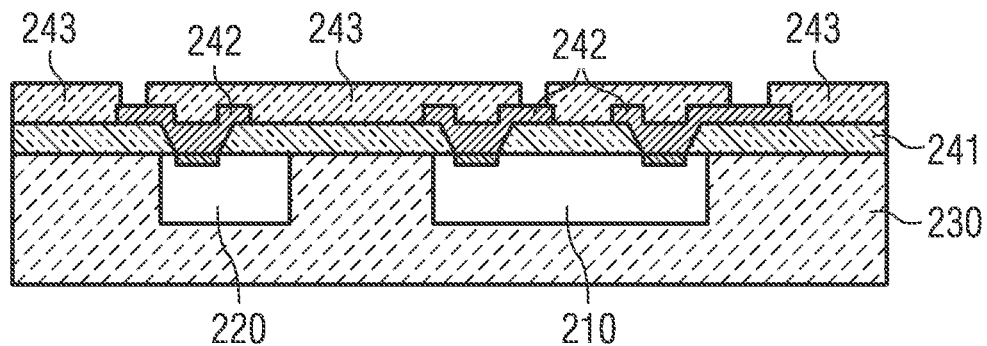

According to FIG. 2C, a second dielectric layer 243 is applied onto the first dielectric layer 241 and the first electrical traces 242. Thereafter, portions of the second dielectric layer 243 above the first electrical traces 242 are removed.

Figure 2D:
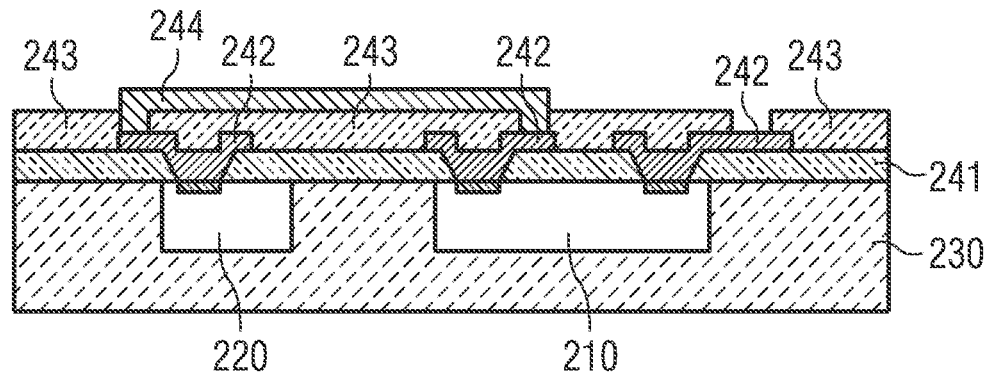

According to FIG. 2D, second electrical traces 244 are deposited on the second dielectric layer 243. There is shown only one second electrical trace 244 which is deposited into two of the selectively removed portions of the second dielectric layer 243 so that the second electrical trace 244 electrically connects two of the first electrical traces 242.

Figure 2E:
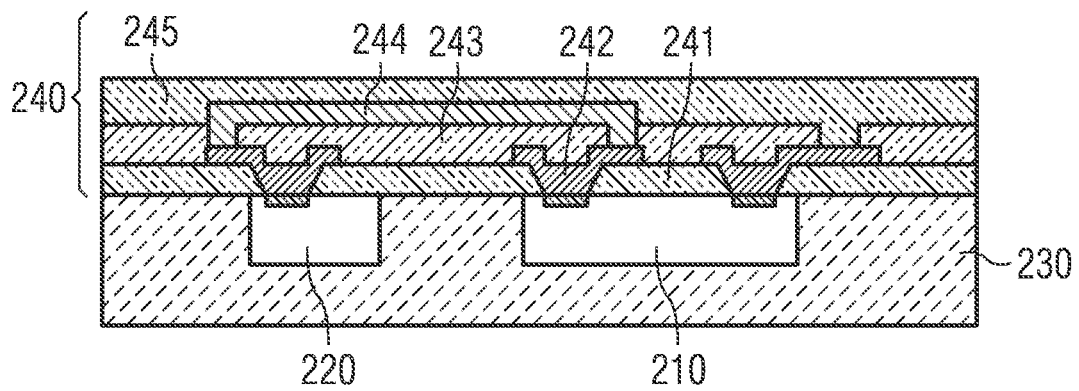

According to FIG. 2E, a third dielectric layer 245 is deposited onto the second dielectric layer 243 and the second electrical traces 244. As a result, a first redistribution layer 240 is obtained which is built-up of the layers 241-245 as set out above.

Figure 2F:
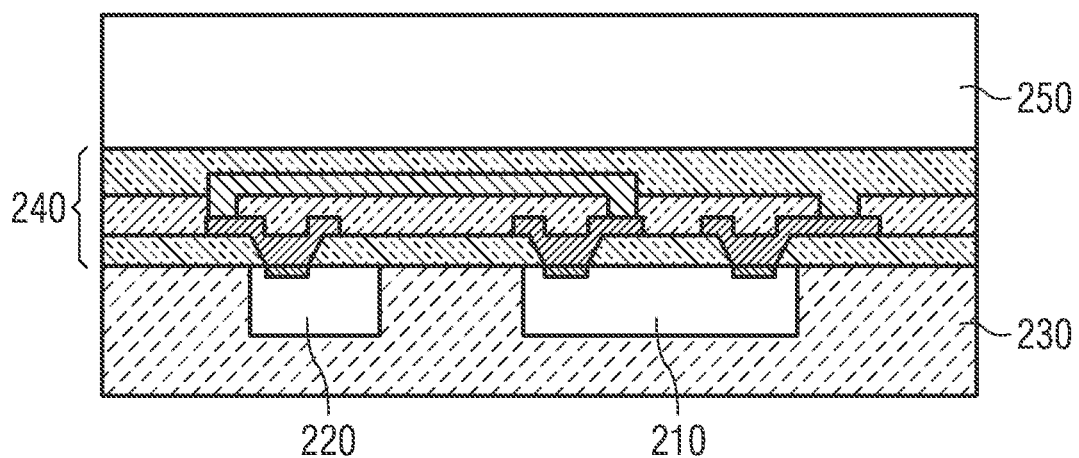

According to FIG. 2F, a second encapsulation layer 250 is deposited onto the first redistribution layer 240, i.e., on the third dielectric layer 245.

According to FIG. 2G, thereafter the semiconductor chips 210 and 220 and the first encapsulation layer 230 are successively removed from their backsides which can be performed, for example, by grinding, planarizing, polishing, in particular chemical-mechanical polishing (CMP). The removing of the semiconductor chips 210 and 220 and of the first encapsulation layer 230 can be done until the thickness of the semiconductor chips 210 and 220 is below 150 µm, in particular below 30 µm, or even as low as 5 µm. Thereafter, a through-hole is formed on the right side of the intermediate product in the first encapsulation layer 230 and the first dielectric layer 241 in such a way that the through-hole extends from an exposed surface of the first encapsulation layer 230 to one of the electrical traces.

According to FIGS. 2H-2J, a second redistribution layer 260 is formed on the back main faces of the semiconductor chips 210 and 220 and the back surface of the first encapsulation layer 230. At first an electrically conductive material like, for example, copper is filled into the through-hole. Then a metallization layer 261 is deposited on the back surfaces of the semiconductor chips 210 and 220 and partly also on the back surface of the first encapsulation layer 230, the metallization layer 261 comprising a first electrical contact layer 261.1 applied to the back main face of the first semiconductor chip 210 and a portion of the back surface of the first encapsulation layer 230, and a second electrical contact layer 261.2 applied to the back main face of the second semiconductor chip 220 and a portion of the back surface of the first encapsulation layer 230. The metallization layer 261 can be fabricated, for example, of copper. As a result, an intermediate product is obtained as shown in FIG. 2H.

According to FIG. 2I, a solder resist layer 262 is applied onto the metallization layer 261 and remaining portions of the back surface of the first encapsulation layer 230. Thereafter, portions of the solder resist layer 262 are removed to expose underlying portions of the first and second electrical contact layers 261.1 and 261.2.

According to FIG. 2J, an electrically conductive material 263 is filled into the through-openings of the solder resist layer 262 to make electrical contact with the first and second electrical contact layers 261.1 and 261.2. Thereafter, the electrically conductive material 263 can be planarized so that its lower surface is flush with the lower surface of the solder resist layer 262. The electrically conductive material 263 can, for example, be made of NiPPdAu. At the end the semiconductor chip panel is singulated into a plurality of identical semiconductor devices or semiconductor chip packages. As a result, a semiconductor chip package, as shown in FIG. 2J, is obtained which can be mounted, for example, by surface mount technology (SMT) on a printed circuit board.

In FIGS. 3A-3F a further example of a method for fabricating a semiconductor device is shown in which an overmold layer can be utilized for a double-side cooling configuration.

According to FIG. 3A, a semiconductor chip 310 is provided which may comprise a vertical transistor structure like, for example, an insulated gate bipolar transistor. At first, the semiconductor chip 310 can be embedded in a first encapsulation layer 330 in the same way as explained in connection with FIG. 2A. The semiconductor chip 310 will be embedded in the first encapsulation layer 330 in such a way that the first encapsulation layer 330 covers the back main face and side faces of the semiconductor chip 310. In a lateral distance to the semiconductor chip 310, a blind hole 331 is formed into the first encapsulation layer 330. Thereafter, a first dielectric layer 320 is applied on an upper surface of the semiconductor chip 310 and an upper surface of the first encapsulation layer 330. In the first dielectric layer 320 through-holes are formed in areas above electrical contact pads of the semiconductor chip 310. Thereafter, the blind hole 331 of the first encapsulation layer 330 is filled with an electrically conductive material as, for example, copper so that in this way a metallic bar or post is fabricated which is designated with reference sign 340. Then first and second metallic layers 341 and 342 are deposited wherein the first metallic layer 341 is formed within the through-holes of the first encapsulation layer 330 above the metallic bar 340 and one of the electrical contact pads of the semiconductor chip 310 and the first metallic layer 341 is also deposited in such a way so that the metallic bar 340 and the one electrical contact pad of the semiconductor chip 310 are electrically connected with each other. The second metallic layer 342 is formed on the other one of the electrical contact pads of the semiconductor chip 310. The first and second metallic layers 341 and 342 can also be fabricated, for example, by copper. As a result, an intermediate product, as shown in FIG. 3A, is fabricated.

According to FIG. 3B, a metallic bar 350 is applied to the second metallic layer 342. The metallic bar 350 can also be fabricated, for example, by copper. In the following the metallic bar 350 and the underlying metallic layer 342 will be represented by a unified element with reference sign 350.

According to FIG. 3C, a second encapsulation layer 360 is applied onto the upper surface of the first dielectric layer 320, the first metallic layer 341 and the metallic bar 350 so that the second encapsulation layer 360 forms an over-mold layer of the front side of the intermediate product.

Figure 3D:
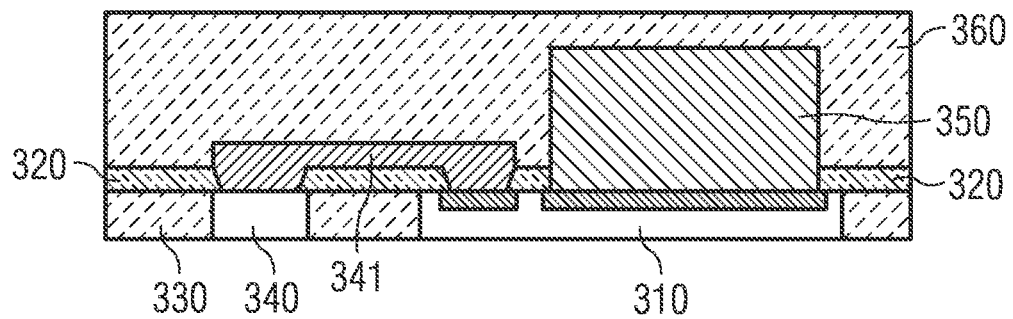

According to FIG. 3D, the back surface of the first encapsulation layer 330 is successively removed until the back main face of the semiconductor chip 310 and also the back surface of the metallic bar are reached and then, removing of the first encapsulation layer 330, the first semiconductor chip 310 and metallic bar 340 is continued down to a particular thickness of the semiconductor chip 310 as shown in FIG. 3D. The process of removing can be accomplished by one or more of grinding, planarizing, or polishing, in particular chemical-mechanical polishing (CMP).

Figure 3E:
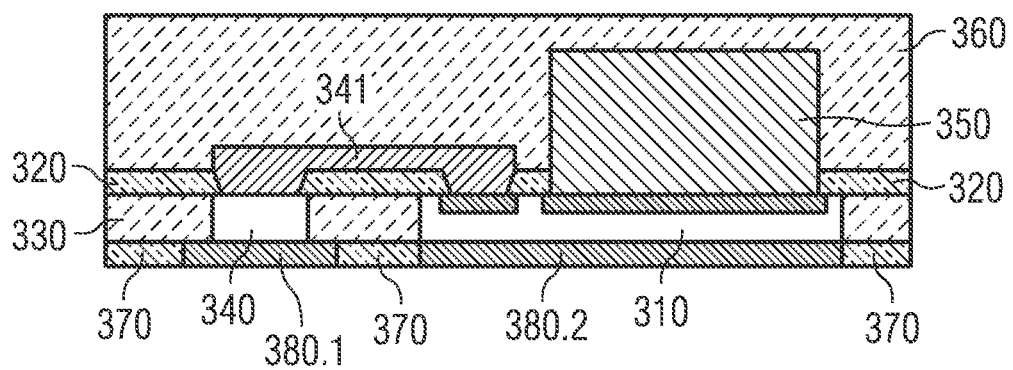

According to FIG. 3E, a metallization layer is applied onto the thinned back side of the semiconductor chip 310 and the back surface of the metallic bar 340. This can be done, for example, by first depositing a second dielectric layer 370 and then applying electrical contact layers 380.1 and 380.2 in areas where the dielectric layer 370 has been removed so that first electrical contact layer 380.1 is applied to the back surface of the metallic bar 340 and the second electrical contact layer 380.2 is applied to the lower main face of the semiconductor chip 310. In case of an insulated gate bipolar transistor, the second electrical contact 380.2 is applied to the drain terminal of the semiconductor chip 310. The first and second electrical contact layers 380.1 and 380.2 can also be fabricated, for example, of copper.

Figure 3F:
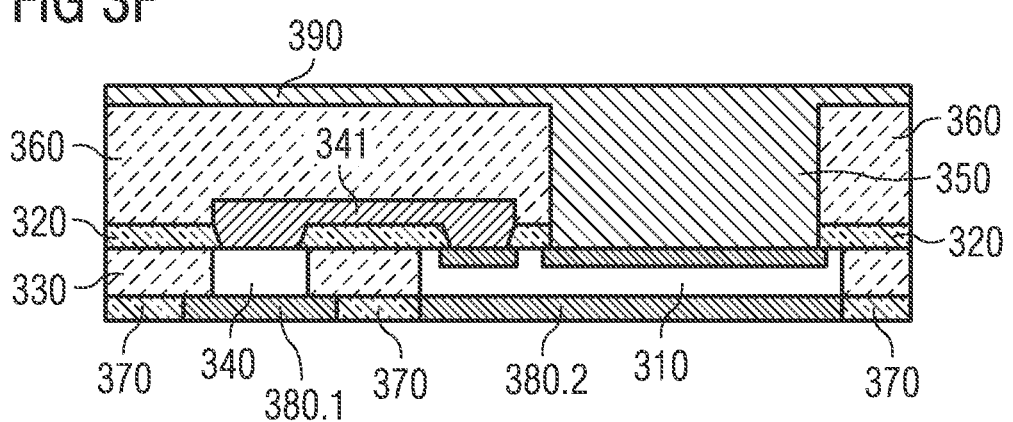

According to FIG. 3F, the upper surface of the second encapsulation layer 360 is reduced until the upper surface of the metallic bar 350 is exposed and afterwards a third electrical contact layer 390 is applied onto an entire upper surface of the semiconductor device, thus being electrically connected to the metallic bar 350. As a result, a semiconductor device is fabricated which is double side configured for electrical and thermal contact in such a way that optimal heat dissipation is facilitated in particular as an effect of the large and thick metallic bars and layers 340, 341 and 350.

According to FIGS. 4A-4E, another example of a method for fabricating a semiconductor device is shown which comprises an over-mold layer and a thinned semiconductor chip in a ball grid semiconductor chip package.

Figure 4A:
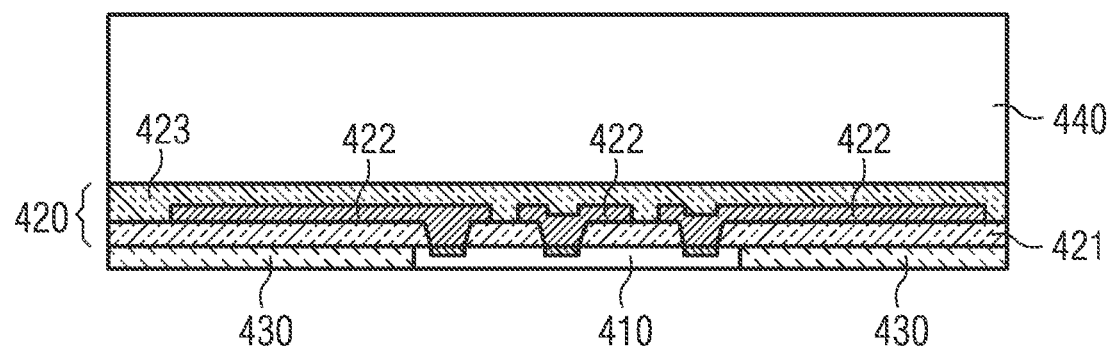
FIGS. 4A-4E show schematic cross-sectional side view representations for illustrating an example of a method for fabricating a semiconductor device comprising an over-mold layer and a thinned semiconductor chip in, e.g., ball grid semiconductor chip package.

FIG. 4A shows an intermediate product which is partly comparable to the one shown in FIG. 2G, at least in so far as the thinning process is already performed. The intermediate product shown in FIG. 4A comprises a thinned semiconductor chip 410 laterally embedded in a first encapsulation layer 430. On the first upper main face of the semiconductor chip 410 and the upper surface of the first encapsulation layer 430 a redistribution layer 420 is applied. The redistribution layer 420 comprises a first dielectric layer 421, electrical contact layers 422 applied onto the first dielectric layer 421, wherein each one of the electrical contact layers 422 is connected with one of the electrical contact pads of the semiconductor chip 410 through via-holes formed in the first dielectric layer 421. The redistribution layer 420 further comprises a second dielectric layer 423 applied onto the first dielectric layer 421 and the electrical contact layers 422. A second encapsulation layer 440 is applied in the form of an over-mold layer on the redistribution layer 420, i.e., on an upper surface of the second dielectric layer 423.

Figure 4B:
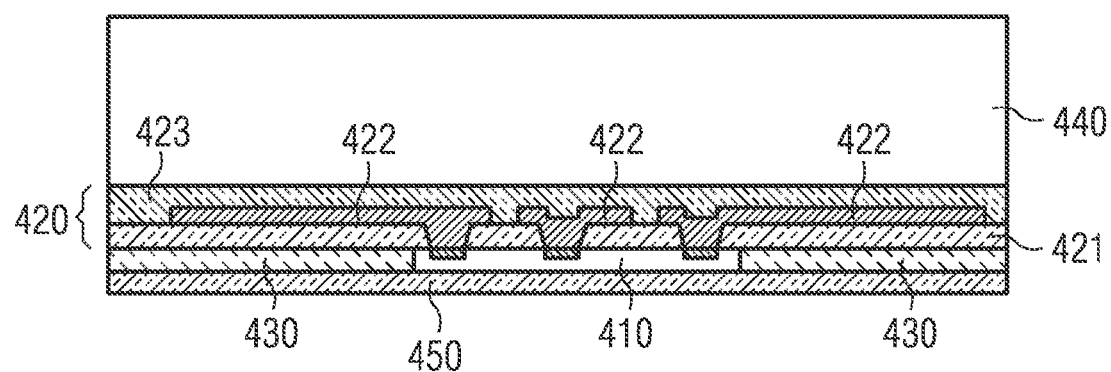

According to FIG. 4B, a third dielectric layer 450 is applied onto the back main face of the semiconductor chip 410 and the back surface of the first encapsulation layer 430.

Figure 4C:
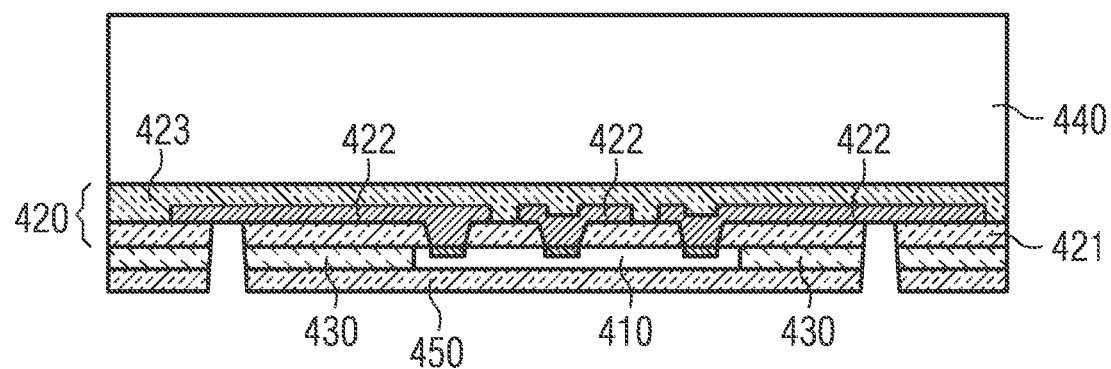

According to FIG. 4C, two through-holes are formed into the third dielectric layer 450, the first encapsulation layer 430, and the first dielectric layer 421 in such a way that each one of the two through-holes extends from a lower surface of the third dielectric layer 450 to one of the electrical contact layers 422. The through-holes can be formed by, for example, laser drilling.

Figure 4D:
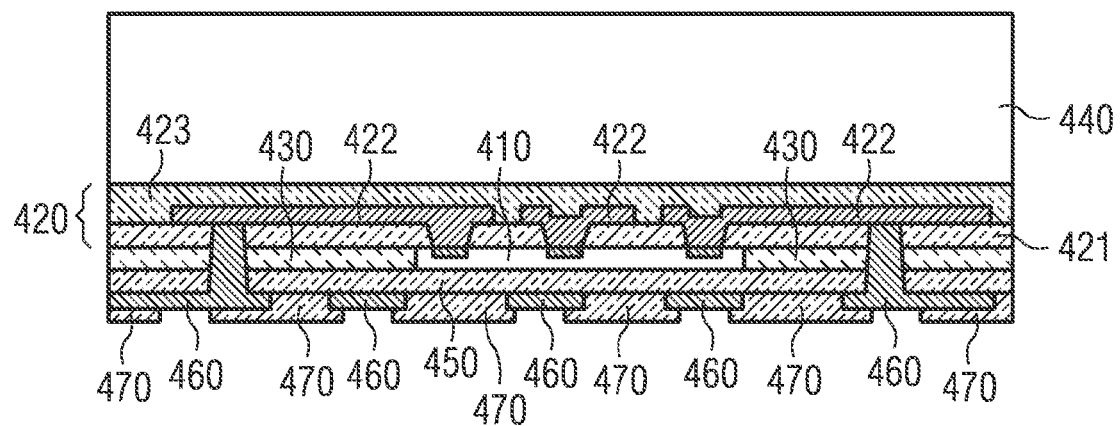

According to FIG. 4D, the through-holes are filled with an electrically conductive material like, for example, copper so as to form electrical through-connections, and afterwards electrical contact layers 460 are applied onto the electrical through-connections and also other areas of the third dielectric layer 450. Then a solder stop layer 470 is applied onto the electrical contact layers 460 and the third dielectric layer 450 in such a way that the electrical contact layers 460 or portions thereof are exposed. As a result, an intermediate product, as shown in FIG. 4D, is fabricated.

Figure 4E:
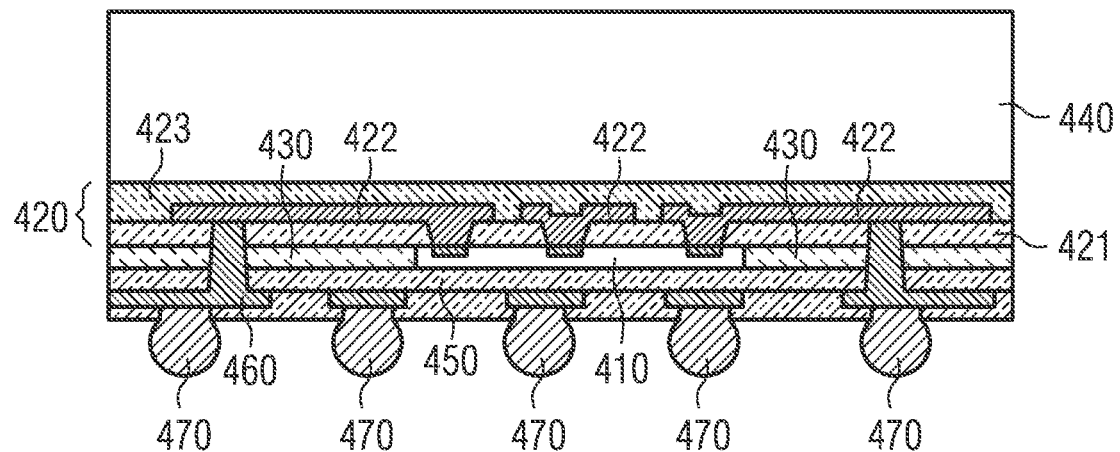

According to FIG. 4E, electrically conductive or solder balls 470 are applied onto the electrically conductive areas 460. As a result, a ball grid semiconductor device is fabricated as shown in FIG. 4E.

According to FIGS. 5A-5E, another example of a method for fabricating a semiconductor device is shown which facilitates utilizing an over-mold layer for fabricating special semiconductor chip packages.

Figure 5A:
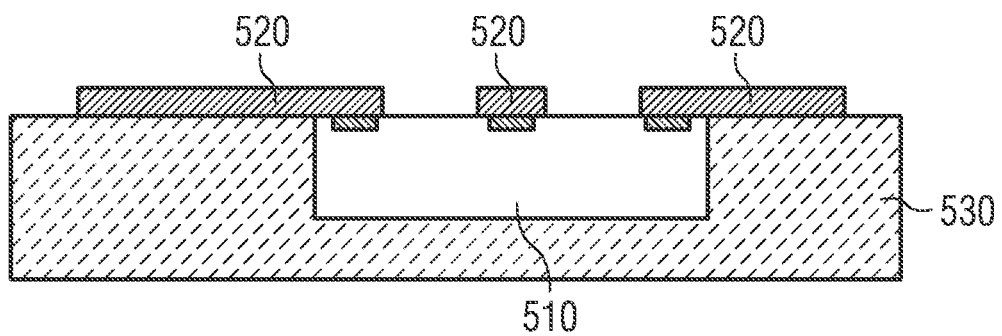
FIGS. 5A-5E show schematic cross-sectional side view representations for illustrating an example of a method for fabricating a semiconductor device in the form of a leadless package device.

FIG. 5A shows a semiconductor chip 510 which may comprise a vertical transistor structure. The semiconductor chip 510 is shown embedded in a first encapsulation layer 530 wherein the semiconductor chip 510 is covered by the first encapsulation layer 530 on its back main face and its side faces. A metallization layer 520 is applied to a front main face of the semiconductor chip 510 and portions of an upper surface of the first encapsulation layer 530. The metallization layer 520 comprises separate portions of layers, each one being applied onto one of the electrical contact pads of the semiconductor chips 510 and extends laterally beyond the outer edges of the semiconductor chip 510 ("fan-out").

Figure 5B:
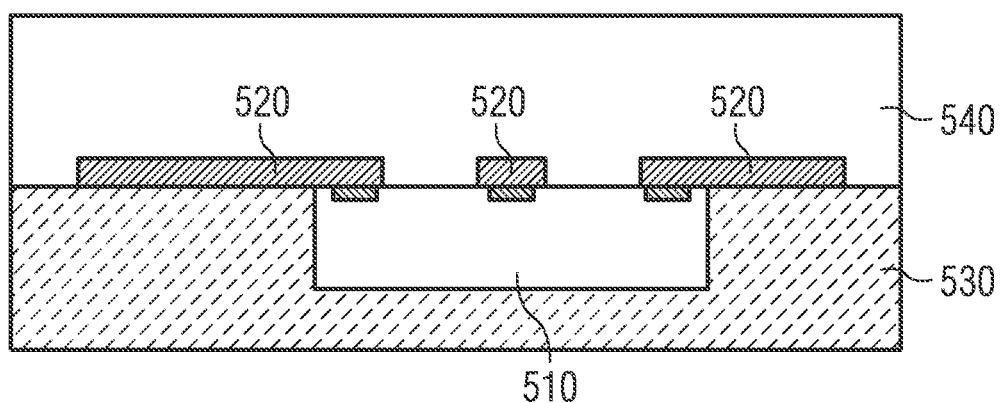

According to FIG. 5B, a second encapsulation layer 540 is applied onto the front main face of the semiconductor chip 510, the metallization layer 520 and the first encapsulation layer 530. As a result, an intermediate product, as shown in FIG. 5B, is obtained.

Figure 5C:
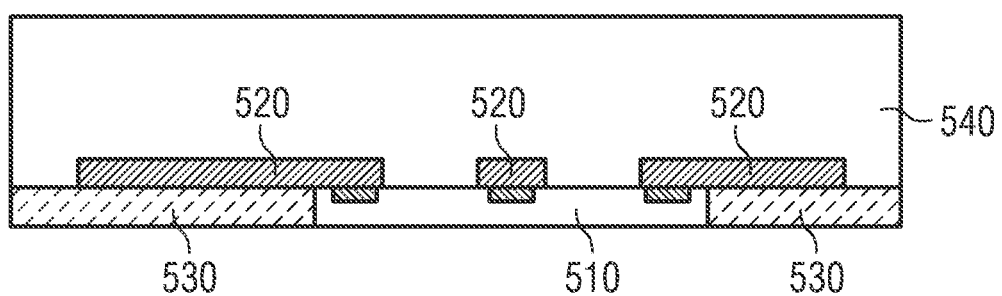

According to FIG. 5C, the first encapsulation layer 530 is successively removed from its back surface and when reaching the back main face of the semiconductor chip 510, also the semiconductor chip 510 is successively removed from its back main face until a particular predetermined thickness of the semiconductor chip 510 and the first encapsulation layer 530 is reached. The successive removing of the first encapsulation layer 530 and the semiconductor chip 510 can be performed by grinding, planarizing, polishing, in particular chemical-mechanical polishing (CMP). As a result, an intermediate product, as shown in FIG. 5C, is obtained.

Figure 5D:
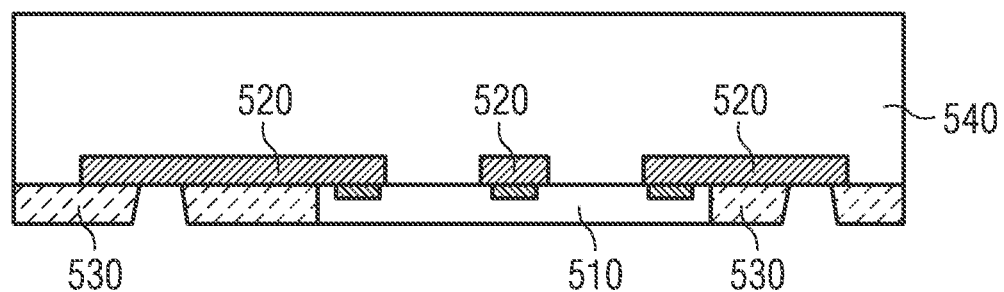

According to FIG. 5D, through-holes are formed into the first encapsulation layer 530, the through-holes reaching from the back surface of the first encapsulation layer 530 to one of the portions of the metallization layer 520, respectively.

Figure 5E:
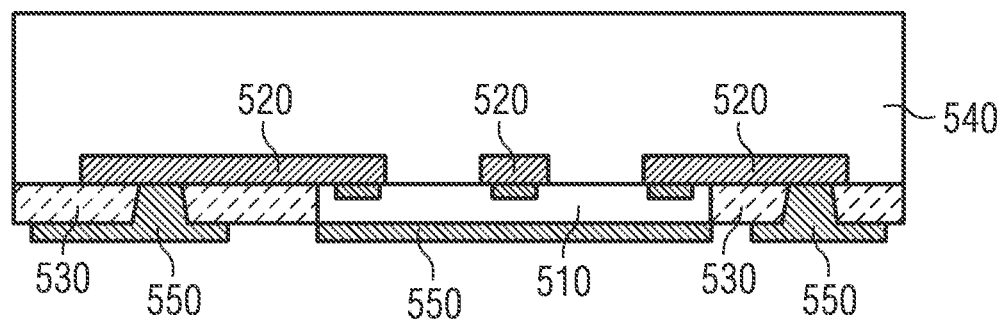

According to FIG. 5E, the through-holes are filled with an electrically conductive material which can, for example, be made of copper. In this way electrical through-connections reaching from the portions of the metallization layer 520 to the lower surface of the first encapsulation layer 530 are fabricated. Thereafter, a metallization layer 550 is applied onto the back surfaces of the semiconductor chip 510 and the first encapsulation layer 530. The metallization layer 550 comprises separate portions, one of the portions being applied to the back main face of the semiconductor chip 510 and the other portions being applied to the back surface of the first encapsulation layer 530, namely on portions where the through-connections to the portions of the metallization layer 510 are located. As a result, a semiconductor device or semiconductor chip package, as shown in FIG. 5E, is obtained. In particular, the semiconductor chip package can be fabricated in the form of a so-called QFN (Quad Flat Non-Leaded) package or in the form of an SON (Small Outline Non-Leaded) package.

Figure 6A:
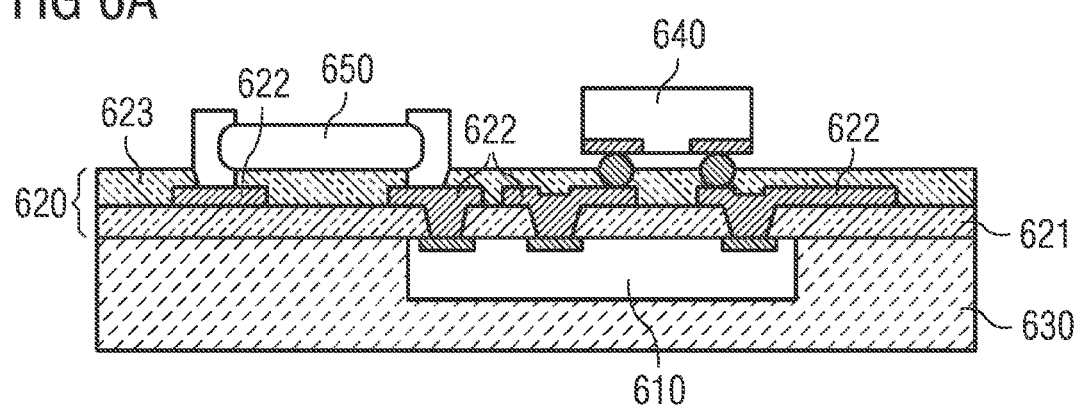
FIGS. 6A and 6B show schematic cross-sectional side view representations for illustrating an example of a method for fabricating a semiconductor device comprising a thinned or unthinned semiconductor chip and an over-mold layer having embedded therein an integrated circuit chip and an additional electrical device.
Figure 6B:
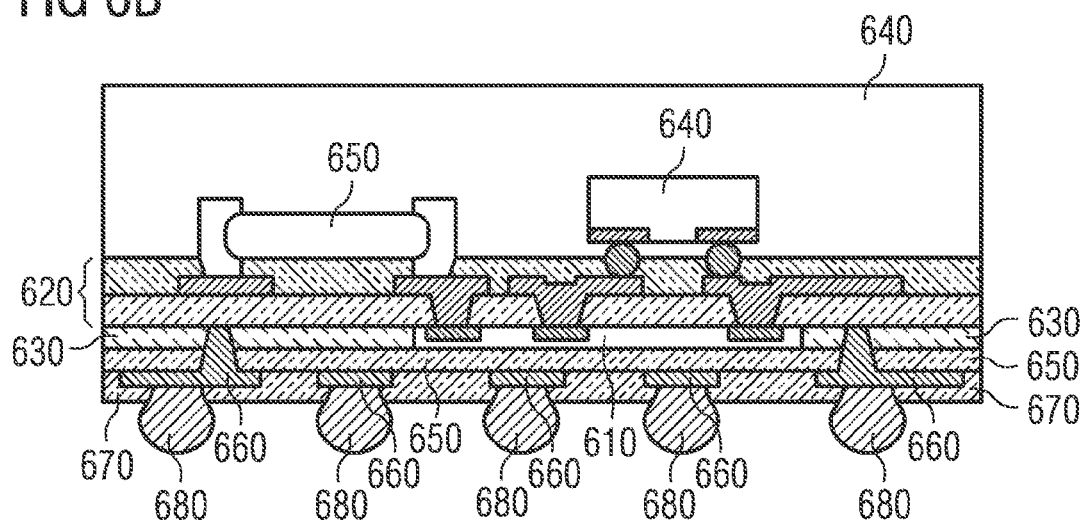

According to FIGS. 6A and 6B, a further example of a method for fabricating a semiconductor device is shown in which a first, thinned semiconductor chip, a second unthinned semiconductor chip and a passive device are integrated within the semiconductor chip package.

FIG. 6A shows a semiconductor chip 610 embedded in a first encapsulation layer 630 together with a redistribution layer 620 applied on a front surface of the semiconductor chip 610 and an upper surface of the first encapsulation layer 630. The semiconductor chip 610 may comprise a vertical transistor structure. The redistribution layer 620 comprises a first dielectric layer 621, a metallization layer 622, and a second dielectric layer 623. So far the intermediate product is comparable to that shown in FIG. 2C and may have been fabricated in the same way. In a next step further electrical devices are arranged above the redistribution layer 620. In particular, a second semiconductor chip 640 and a passive electrical device 650 are mounted on the redistribution layer 620 and electrical contact terminals of the second semiconductor chip 640 and the passive electrical device 650 are connected with contact areas of the metallization layer 622. In this way the second semiconductor chip 640 is electrically connected with the first semiconductor chip 610. The second semiconductor chip 640 can comprise, for example, one or more of an integrated circuit (IC) chip, a controller chip, a microprocessor chip, or a memory chip. The passive electrical device 650 may comprise, for example, one or more of a resistor, an inductor, or a capacitor.

According to FIG. 6B, several process steps have been performed which were also described above in the example as shown in FIGS. 4A-4E. At first a second encapsulation layer 640 is applied over the redistribution layer 620 and the devices 640 and 650. The next process steps can be identical to those described in connection with FIGS. 4A-4E. Basically the first semiconductor chip 610 and the first encapsulation layer 630 are thinned and a dielectric layer 650, electrical contact areas 660, a solder resist layer 670, and solder balls 680 are applied in such a way on the back surfaces of the semiconductor chip 610 and the encapsulation layer 630 that several ones of the contact layer 622 of the redistribution layer 620 are electrically connected by through-connections with one of the electrical contact areas 660. As a result, a semiconductor device or semiconductor chip package, as shown in FIG. 6B, is obtained. Instead of forming a ball grid array package, it is also possible to form lower electrical contacts such as those shown in FIG. 2J or FIG. 3F.

Figure 7A:
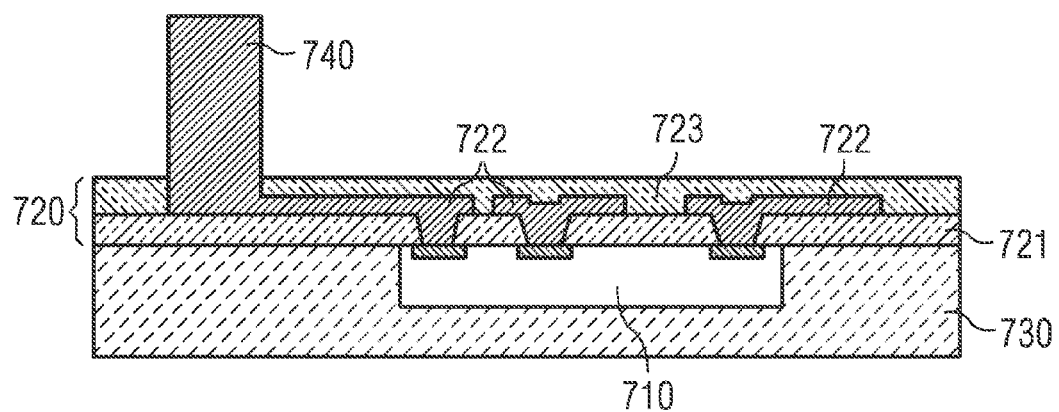
FIGS. 7A and 7B show schematic cross-sectional side view representations for illustrating an example of a method for fabricating a semiconductor device comprising a thinned semiconductor chip and an over-mold layer and an antenna applied on a surface of the over-mold layer.
Figure 7B:
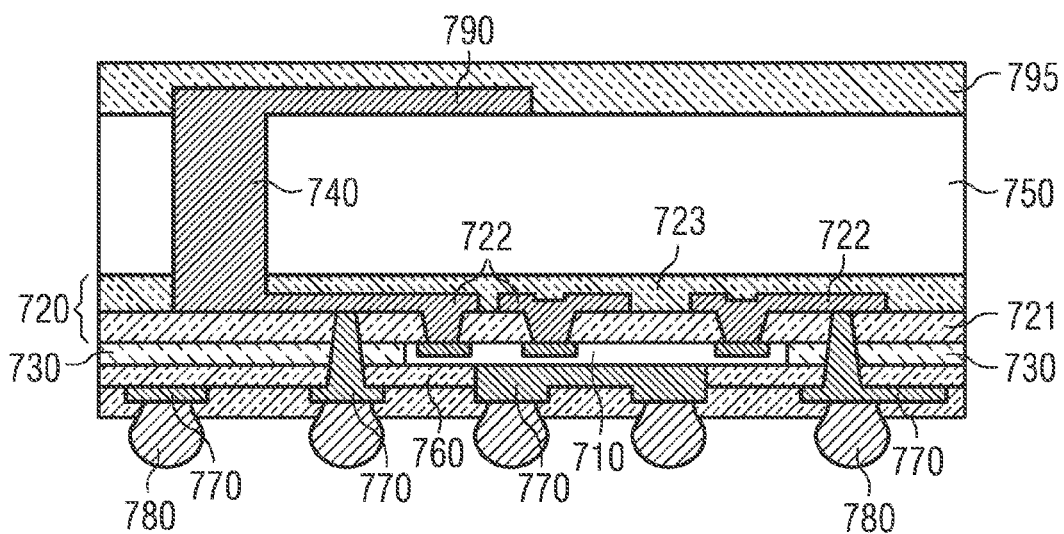

In FIGS. 7A and 7B a further example of a method for fabricating a semiconductor device is shown in which the over-mold layer may be utilized to integrate a device like an antenna on the surface of the over-mold layer.

FIG. 7A shows an intermediate product comparable with that shown in FIG. 2E, the intermediate product comprising a semiconductor chip 710 embedded in a first encapsulation layer 730. A redistribution layer 720 is applied on a first, upper main face of the semiconductor chip 710 and an upper surface of the first encapsulation layer 730. The redistribution layer 720 comprises a first dielectric layer 721, a metallization layer 722, and a second dielectric layer 723. The metallization layer 722 comprises several portions of metallic layers, each one of the metallic layers being connected with one of the electrical contact pads of the semiconductor chip 710. Above an end portion of one of the metallic layers of the metallization layer 722 an opening is formed in the second dielectric layer 723 and a metallic bar 740 is placed in the opening so that it is electrically connected to the one of the metallic layers. The metallic bar 740 extends in a vertical direction from the plane of the redistribution layer 720. As a result, an intermediate product, as shown in FIG. 7A, is obtained.

According to FIG. 7B, several additional process steps have been performed to obtain a semiconductor device as shown. At first a second encapsulation layer 750 is applied over the redistribution layer 720 in such a way that an upper surface of the second encapsulation layer 750 is flush with an upper surface of the metallic bar 740. Then essentially the same steps are carried out as were described above in connection with FIGS. 4A-4E. In particular, the back surfaces of the semiconductor chips 710 and of the first encapsulation layer 730 are progressively removed until a final predetermined thickness of these layers has been reached. Then a second dielectric layer 760 is applied on the back surfaces of the semiconductor chip 710 and the first encapsulation layer 730. Then via holes are formed in the first encapsulation layer 730, the second dielectric layer 760 and the first dielectric layer 721 and metallization layers 770, and solder balls 780 are successively applied over the back surfaces of the semiconductor chip 710 and the first encapsulation layer 730. More important is that the presence of the second encapsulation layer 750 can now be utilized to integrate an antenna in the semiconductor chip package. The antenna 790 can be applied on the upper surface of the second encapsulation layer 750 in such a way that an end portion of the antenna 790 is connected with the upper end of the metallic bar 740. For reasons of, for example, protection, an additional layer 795, for example, a lamination foil, can be applied over the second encapsulation layer 750 and the antenna 790. As a result, a semiconductor chip package, as shown in FIG. 7B, is obtained.

FIGS. 8A-8M show another example of a method for fabricating a semiconductor device in which two thinned semiconductor chips can be built together in a stacked configuration.

Figure 8A:
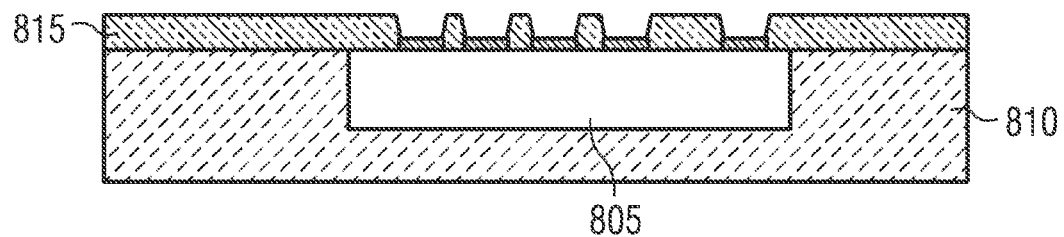
FIGS. 8A-8M show schematic cross-sectional side view representations for illustrating a method for fabricating a semiconductor device comprising two thinned semiconductor chips in a stacked configuration together with an over-mold layer.

According to FIG. 8A, a first semiconductor chip 805 is embedded in a first encapsulation layer 810 in such a way that the back surface and the side faces of the semiconductor chip 805 are covered by the first encapsulation layer 810. Then a dielectric layer 815 is applied onto the front surface of the semiconductor chip 805 and the upper surface of the first encapsulation layer 810. Via openings are formed in the first dielectric layer 815 above electrical contact pads of the first semiconductor chip 810.

Figure 8B:
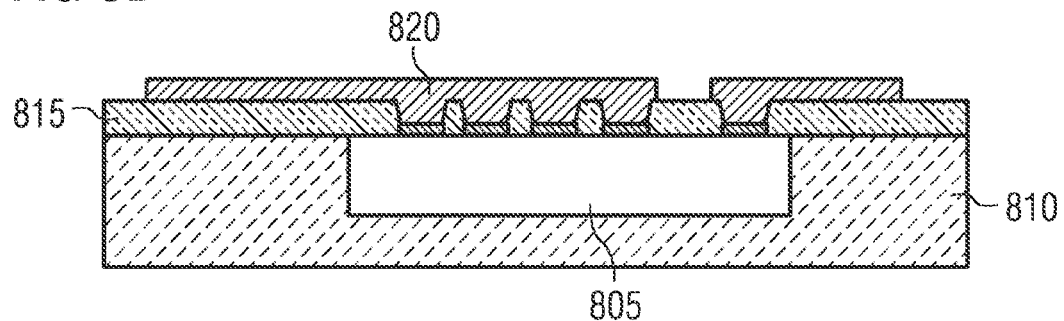

According to FIG. 8B, a metallization layer 820 is applied, the metallization layer 820 comprising a plurality of electrical traces, each one of which is connected with one of the electrical contact pads of the first semiconductor chip 805.

Figure 8C:
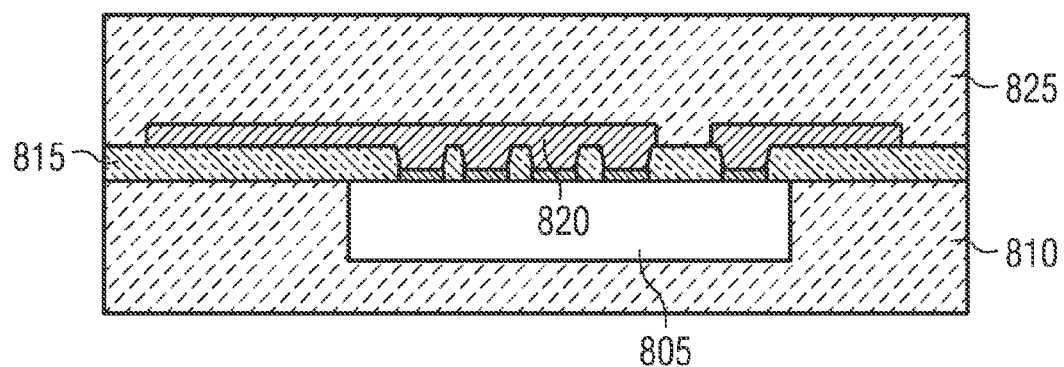

According to FIG. 8C, a second encapsulation layer 825 is applied over the front side of the intermediate product, i.e., above the first dielectric layer 815 and the metallization layer 820.

Figure 8D:
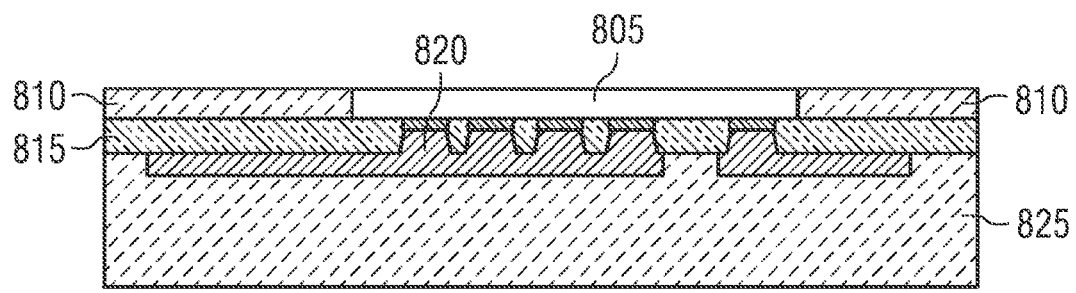

According to FIG. 8D, an intermediate product is shown after thinning the first semiconductor chip 805 and the first encapsulation layer 810 and turning the intermediate product upside down. As described above, thinning can be performed by one or more of grinding, planarizing, polishing, in particular chemical-mechanical polishing (CMP).

Figure 8E:
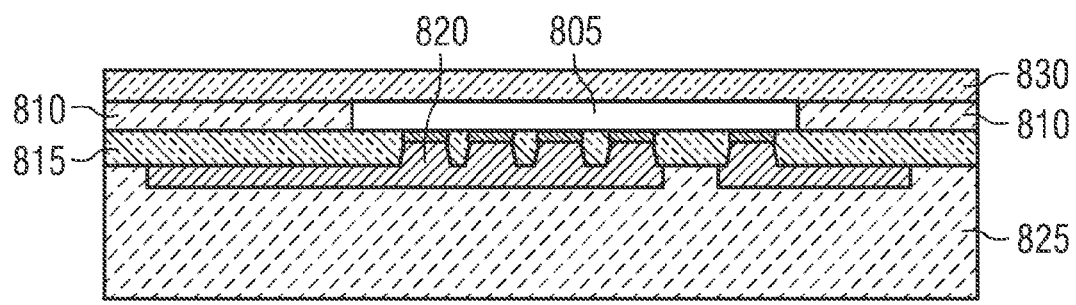

According to FIG. 8E, a second dielectric layer 830 is applied over the exposed surface of the first semiconductor chip 815 and the exposed surface of the first encapsulation layer 810.

Figure 8F:
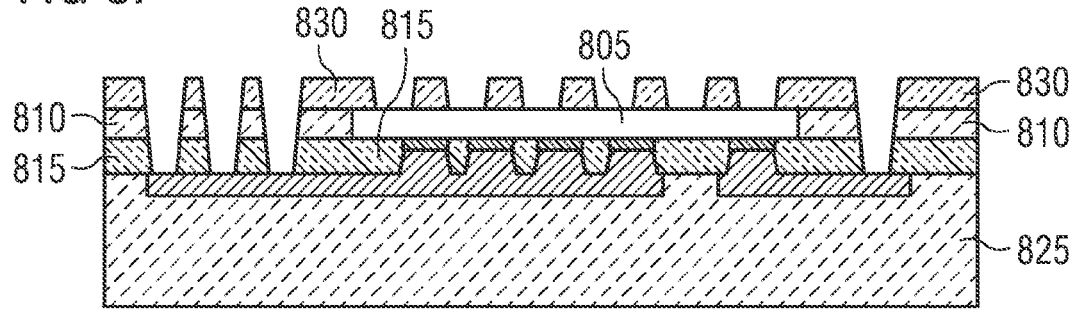

According to FIG. 8F, via openings are formed in the second dielectric layer 830 above the first semiconductor chip 815 and also laterally outside of the first semiconductor chip 815 through the second dielectric layer 830, the first encapsulation layer 810 and the first dielectric layer 815 down to the metallization layer 820. Thereafter a seed layer may be formed within the via openings, e.g., by sputtering of Ti—Cu (the seed layer is not depicted in the figure).

Figure 8G:
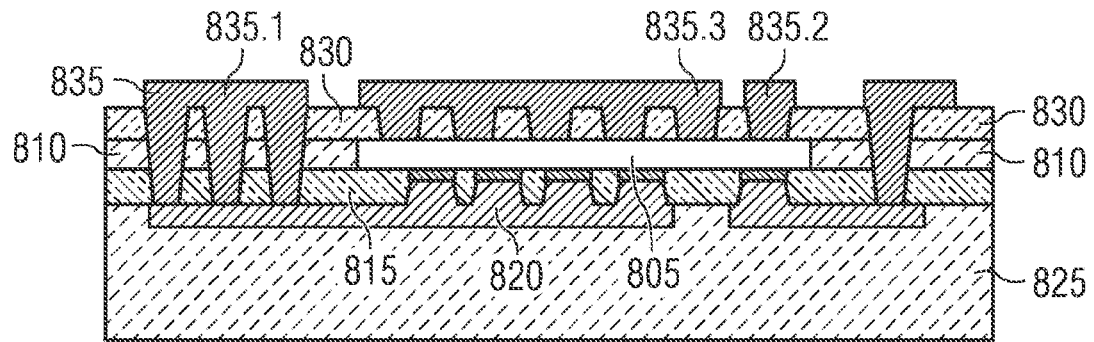

According to FIG. 8G, a second metallization layer 835 is formed on the second dielectric layer 830 and also filled into the via holes formed in the second dielectric layer 830 and the underlying layers. The second metallization layer 835 comprises three different and separate electrical traces as shown in the figure. In particular, the first semiconductor chip 805 may comprise a vertical transistor structure so that a first electrical trace 835.1 is connected with a source contact element of the first semiconductor chip 805, a second electrical trace 835.2 is connected with a gate contact element of the first semiconductor chip 805, and a third electrical trace 835.3 is connected with a drain contact element of the first semiconductor chip 805.

Figure 8H:
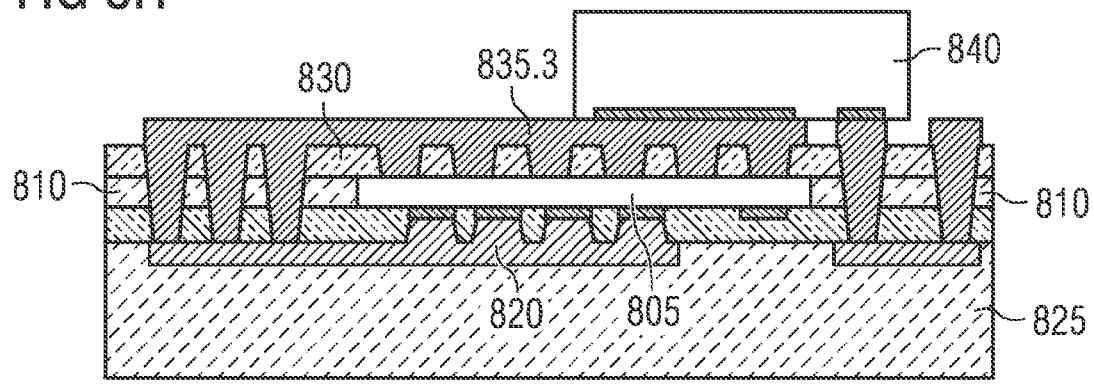

According to FIG. 8H, a second semiconductor chip 840 is applied onto the electrical trace 835.3. FIG. 8H shows the intermediate product at a different cross section than FIG. 8G. The second semiconductor chip 840 may also comprise a vertical transistor structure and it may be connected in such a way that its source contact element is electrically connected with the electrical trace 835.3, i.e., with the drain contact element of the first semiconductor chip 805, and its gate contact element may be connected with the electrical trace 835.2, i.e., with the gate contact element of the first semiconductor chip 805. Thus, the first semiconductor chip 805 may be determined as a low side switch and the second semiconductor chip 840 may be determined as a high side switch of, for example, a power switch module.

Figure 8I:
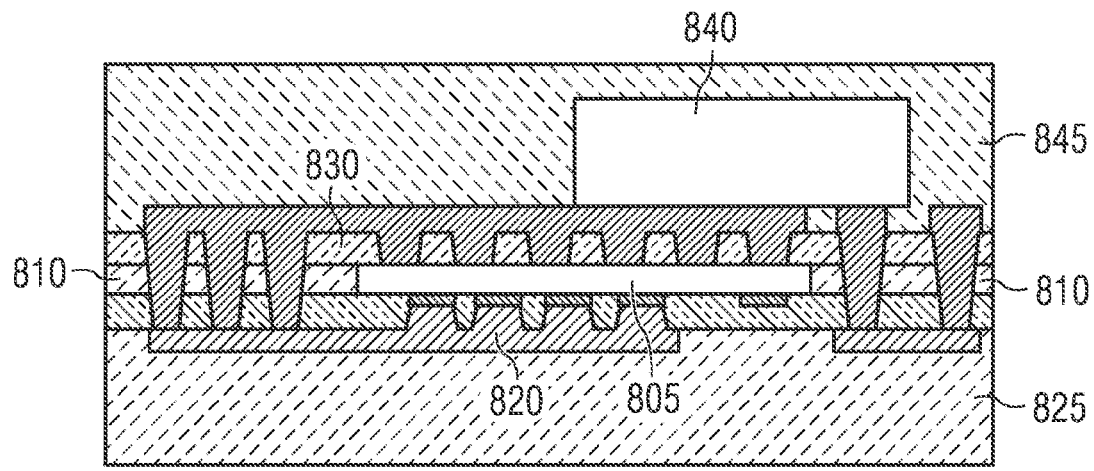

According to FIG. 8I, a third encapsulation layer 845 is applied over the second metallization layer 835 and the second dielectric layer 830 in such a way that the second semiconductor chip 840 is covered by the second encapsulation layer 845.

Figure 8J:
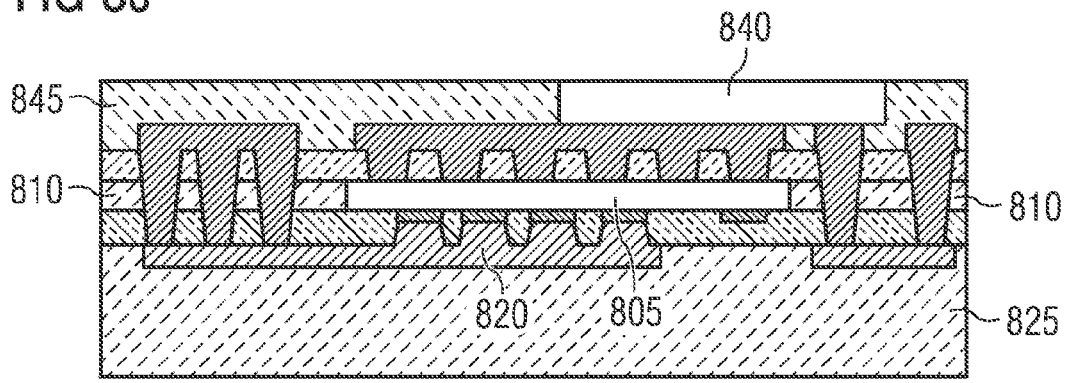

According to FIG. 8J, the second encapsulation layer 845 is successively removed from its upper surface down to the back surface of the second semiconductor chip 840 and, thereafter, both the second encapsulation layer 845 and the second semiconductor chip 845 are further thinned until the second semiconductor chip 840 has reached a predefined thickness.

Figure 8K:
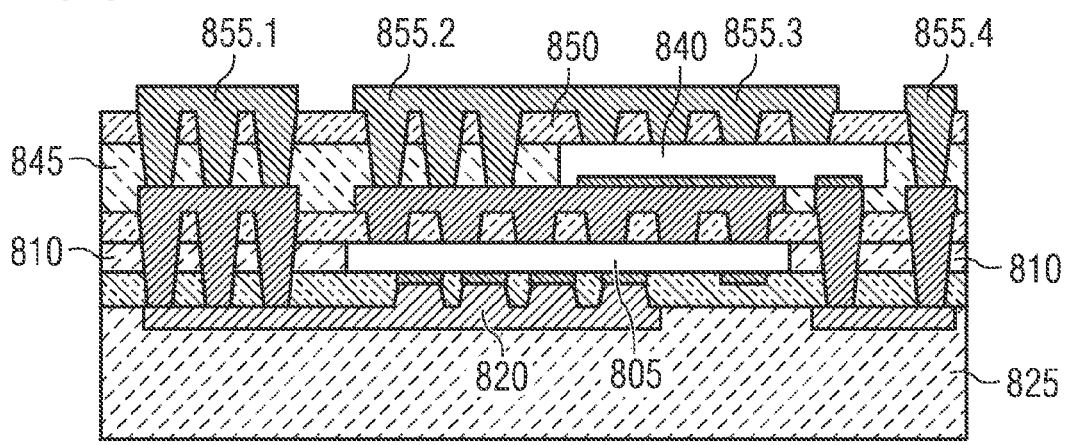

According to FIG. 8K, a third dielectric layer 850 is applied onto the upper exposed surfaces of the second encapsulation layer 845 and the second semiconductor chip 840 and, thereafter, via holes are formed into the third dielectric layer 850 above the second semiconductor chip 840 and also laterally besides the second semiconductor chip 840 via holes are formed into the third dielectric layer 850 and the second encapsulation layer 845. Thereafter, seed layers may be formed into the via holes and thereafter an electrically conductive material is filled into the via holes. Then a metallization layer 855 is formed onto the third dielectric layer 850, the metallization layer 855 comprising electrical traces 855.1, 855.2, 855.3, and 855.4.

Figure 8L:
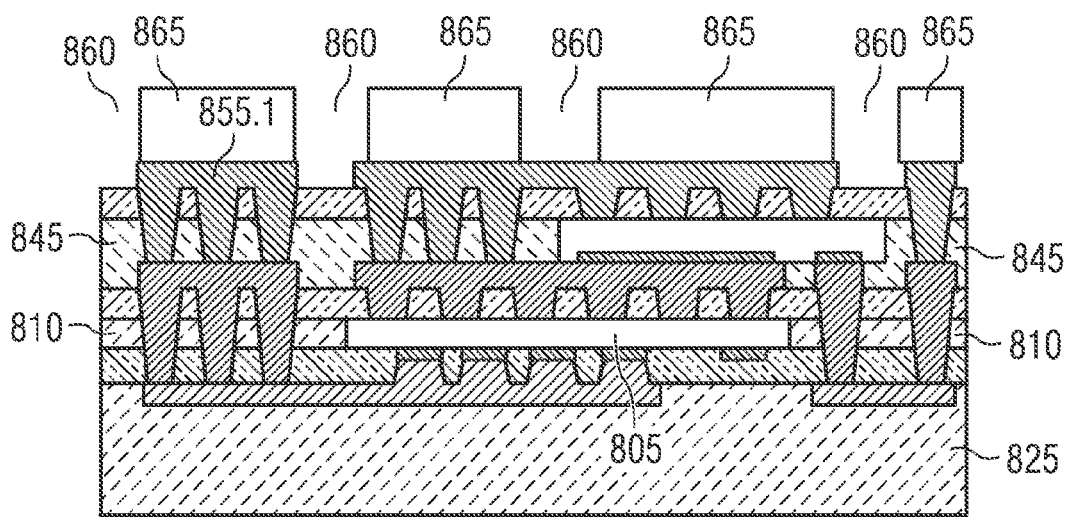

According to FIG. 8L, a solder stop layer 860 is formed over the third dielectric layer 850 and the metallization layer 855 and holes are formed in the solder resist layer 860 in areas above the portions 855.1 to 855.4 of the metallization layer 855. Thereafter, a solder material 865 is formed into the holes of the solder resist layer 860.

Figure 8M:
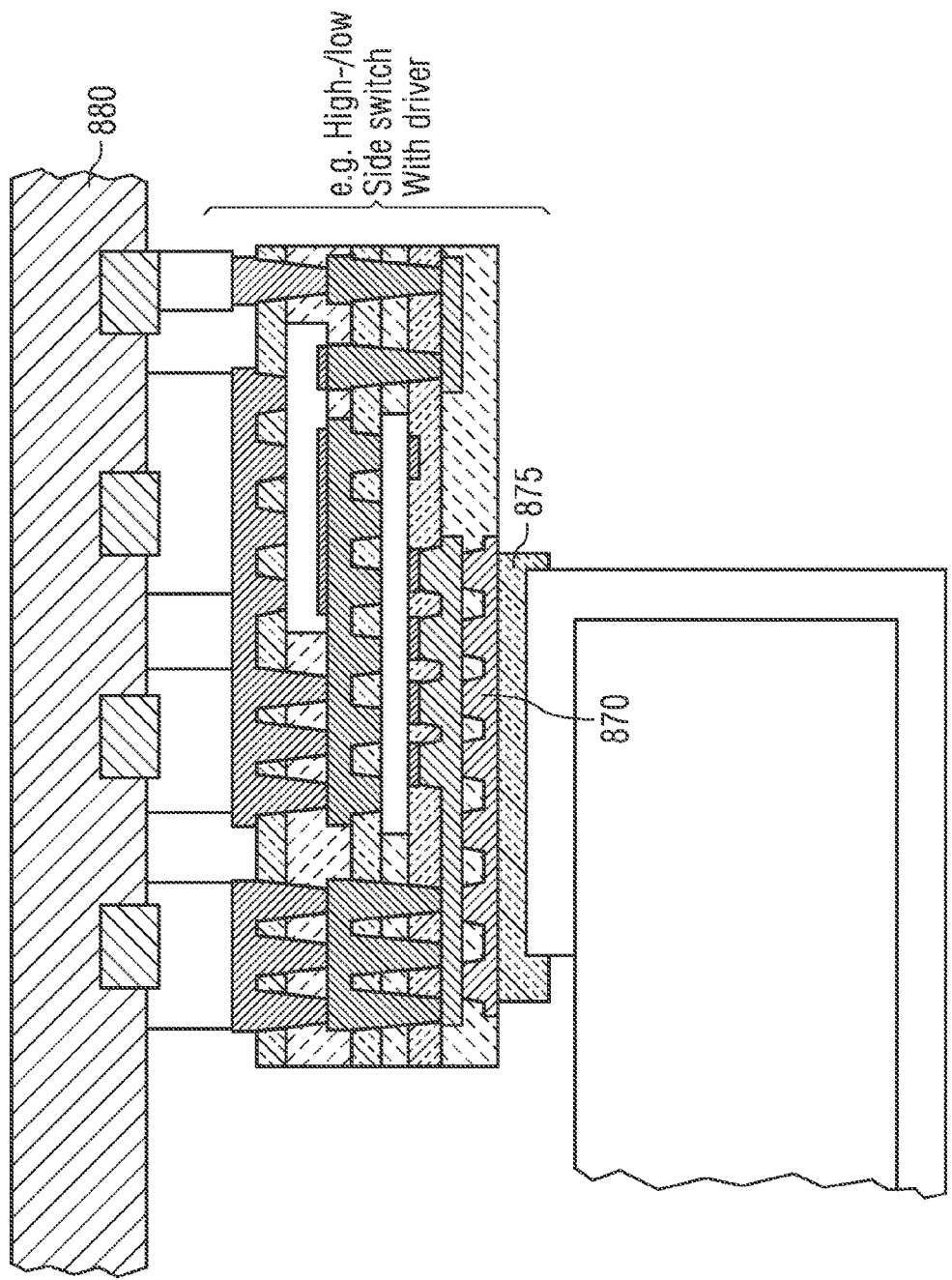

According to FIG. 8M, the semiconductor chip package, as shown in FIG. 8L, can be further processed by thinning the second encapsulation layer 825, applying a metallization layer 870 to the second encapsulation layer 825, and applying a solder material 875 onto the metallization layer 870. The semiconductor chip package thus fabricated can then be electrically connected to a printed circuit board 880 and on the other side a further electrical device like, for example, an inductor can be electrically connected to the solder material 875.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A method for fabricating a plurality of semiconductor devices, the method comprising:
   providing a plurality of first semiconductor chips, each one of the first semiconductor chips comprising a first main face and a second main face opposite to the first main face;
   applying a first encapsulation layer over the second main faces of the first semiconductor chips;
   applying an electrical wiring layer over the first main faces of the first semiconductor chips;
   applying a vertical metallic bars over the electrical wiring layer, the vertical metallic bars being electrically connected to the electrical wiring layer;
   applying a second encapsulation layer over the electrical wiring layer in such a way that an upper surface of the second encapsulation layer is flush with an upper surfaces of the vertical metallic bars;
   reducing a thickness of the first encapsulation layer and thicknesses of the first semiconductor chips;
   applying first electrical devices over the second encapsulation layer, the first electrical devices being electrically connected with the vertical metallic bars; and
   singulating thereby obtaining the plurality of semiconductor devices.

2. The method according to claim 1, wherein each first semiconductor chip comprises a power transistor, a vertical transistor, a MOS transistor, an insulated gate bipolar transistor, a logic circuit, a sensor, or a passive component.

3. The method according to claim 1, wherein the thicknesses of the first semiconductor chips are in a range from 5 μm-150 μm.

4. The method according to claim 1, wherein the first encapsulation layer comprises one or more of an insulating material, a mold material, a polymer material, a polyimide material, a resin material, an epoxy-resin material, a silicone material, a ceramic material, and a glass material.

5. The method according to claim 1, further comprising:
   providing a plurality of second semiconductor chips; and
   applying the second semiconductor chips over the electrical wiring layer so that each one of the second semiconductor chips is electrically connected to a respective one of the first semiconductor chips.

6. The method according to claim 5, wherein each one of the second semiconductor chips comprises one or more of an integrated circuit, a logic circuit, or a control circuit.

7. The method according to claim 1, further comprising:
   providing a plurality of second electrical devices, the second electrical devices being configured as surface mount devices; and
   applying the second electrical devices over the electrical wiring layer so that each one of the second electrical devices is electrically connected to a respective one of the first semiconductor chips.

8. The method according to claim 7, wherein each one of the second electrical devices comprises a resistor, an inductor, a coil, or a capacitor.

9. The method according to claim 1, wherein each first electrical device comprises an antenna.

* * * * *